(12) United States Patent
Chae et al.

(10) Patent No.: US 11,098,244 B2
(45) Date of Patent: Aug. 24, 2021

(54) COMPOSITION COMPRISING INORGANIC NANO PARTICLE STRUCTURE, LIGHT CONVERSION THIN FILM USING THE SAME, AND DISPLAY APPARATUS USING THE FILM

(71) Applicant: Research & Business Foundation Sungkyunkwan University, Suwon-si (KR)

(72) Inventors: Heeyeop Chae, Suwon-si (KR); Changmin Lee, Suwon-si (KR); Eunhee Nam, Suwon-si (KR); HyungSuk Moon, Suwon-si (KR); Hyejin Kim, Suwon-si (KR)

(73) Assignee: Research and Business Foundation Sungkyunkwan University, Suwon-si (KR)

( * ) Notice: Subject to any disclaimer, the term of this patent is extended or adjusted under 35 U.S.C. 154(b) by 334 days.

(21) Appl. No.: 16/389,108

(22) Filed: Apr. 19, 2019

(65) Prior Publication Data
US 2019/0322926 A1    Oct. 24, 2019

(30) Foreign Application Priority Data
Apr. 19, 2018 (KR) .................. 10-2018-0045409

(51) Int. Cl.
| | | |
|---|---|---|
| *C09K 11/02* | (2006.01) | |
| *H01L 33/50* | (2010.01) | |
| *H01L 33/56* | (2010.01) | |
| *C08L 83/04* | (2006.01) | |
| *B82Y 30/00* | (2011.01) | |
| *B82Y 20/00* | (2011.01) | |
| *G02F 1/13357* | (2006.01) | |

(52) U.S. Cl.
CPC ........ *C09K 11/02* (2013.01); *G02F 1/133603* (2013.01); *H01L 33/502* (2013.01); *H01L 33/56* (2013.01); *B82Y 20/00* (2013.01); *B82Y 30/00* (2013.01); *C08L 83/04* (2013.01); *C09K 2211/10* (2013.01); *C09K 2211/14* (2013.01)

(58) Field of Classification Search
CPC . C09K 11/02; C09K 2211/10; C09K 2211/14; G02F 1/133603; B82Y 20/00; B82Y 40/00; C08L 83/04
See application file for complete search history.

(56) References Cited

U.S. PATENT DOCUMENTS 8,394,976 B2 * 3/2013 Pickett .................. B82Y 30/00
556/9
2015/0284627 A1 * 10/2015 Bohmer ............... C09K 11/025
362/84

* cited by examiner

*Primary Examiner* — C Melissa Koslow
(74) *Attorney, Agent, or Firm* — NSIP Law (57) ABSTRACT

The present invention provides a composition containing an inorganic nano-particle structure absorbing blue light and then emitting light and a siloxane compound; a light-conversion thin-film made of the composition; and a display panel using the film. When using the composition, the light-conversion thin-film as an optical member may have high stability. Further, when using the film, a display panel with excellent stability even under high-temperature and high-water conditions may be realized.

11 Claims, 1 Drawing Sheet

COMPOSITION COMPRISING INORGANIC NANO PARTICLE STRUCTURE, LIGHT CONVERSION THIN FILM USING THE SAME, AND DISPLAY APPARATUS USING THE FILM

CROSS-REFERENCE TO RELATED APPLICATION

This application claims a benefit under 35 U.S.C. § 119(a) of Korean Patent Application No. 10-2018-0045409 filed on Apr. 19, 2018, in the Korean Intellectual Property Office, the entire disclosure of which is incorporated herein by reference for all purposes.

BACKGROUND

1. Field

The present disclosure relates to a composition containing an inorganic nano-particle structure and a siloxane compound, a light-conversion thin-film using the composition, and a display device using the film.

2. Description of Related Art

Among display devices, a liquid crystal display (LCD) and an organic light emitting diode (OLED) are rapidly growing technically. Particularly, in the organic light emitting display device, each pixel may be individually controlled. Thus, a contrast ratio thereof is higher than that of the liquid crystal display device. Color rendering of the OLED is superior to that of the LCD. In order for the LCD to compensate for this shortcoming, the liquid crystal display device has ensured the color rendering by using a blue light emitting diode (Blue LED) as a backlight and using quantum dots capable of color conversion.

Quantum dots (QDs) refer to nanocrystals of semiconducting materials having a quantum confinement effect. The QDs generate stronger light in a narrow wavelength band than conventional phosphors. These quantum dots absorb light from a backlight and are brought into a excited state, thereby to emit energy corresponding to an energy band gap of the quantum dots. The luminescence of the quantum dots occurs when excited electrons transition from a conduction band to a valence band. For the same material, a wavelength varies depending on a particle size. These quantum dots emit light with a shorter wavelength as the size thereof decreases. Therefore, when the size or material composition of the quantum dot is controlled, the energy band gap can be controlled, so that light of various wavelength ranges can be obtained.

Further, among the characteristics of the quantum dot, there is an emission having a narrow full width at half maximum (FWHM). Thus, a color conversion film using a quantum dots based film can realize high color rendering.

However, when luminescent inorganic nano-particles are spaced from each other at a small distance, quantum efficiency can be lowered due to energy transfer between the particles. These energy transfer includes Dexter energy transfer and Forster energy transfer. The Dexter energy transfer occurs when a distance between the particles is about 1 nm. Using the Dexter energy transfer, a luminance enhancing sheet used as a backlight device for the liquid crystal display device can enhance the luminance by focusing the light beams on a front face to increase a luminous intensity of the LCD and thus the luminance of the liquid crystal display. The luminance enhancing sheet is made of photocurable monomers. The luminance enhancing sheet made of a monomer having a high refractive index has a higher ability to focus the light beams on a front face, thereby maximizing the effect of enhancing the brightness.

Further, in addition to a conventional film type sheet using the quantum dots, a device disposed on a blue LED backlight and capable of color conversion is being developed. A conventional LED encapsulant employs transparent siloxane having little yellowing. Efforts have been made to use the quantum dots with the encapsulant. However, this has low commerciality and stability.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

A purpose of the present disclosure is as follows: when siloxane compounds currently used as LED encapsulants are cured, functional groups capable of participating in the hydrosilylation reaction are introduced so that optical properties of the quantum dots are not reduced. Thus, reacting these functional groups with the siloxane compounds may allow formation of a quantum dot pattern capable of changing color light from the blue LED and having a stability than a conventional composition based quantum dot pattern.

In a first aspect of the present disclosure, there is provided a composition containing: an inorganic nano-particle structure containing: an inorganic nano-particle; and a ligand bound to a surface of the inorganic nano-particle, wherein the ligand includes at least one of a first ligand having a structure represented by a following Chemical Formula 1-1 and a second ligand having a structure represented by a following Chemical Formula 1-2; a first siloxane compound having a structure represented by a following chemical Formula 2; and a second siloxane compound having a structure represented by a following chemical Formula 3:

[Chemical Formula 1-1]

[Chemical Formula 1-2]

[Chemical Formula 2]

[Chemical Formula 3]

wherein in the Chemical Formula 1-1 and Chemical Formula 1-2, each of $X_1$ and $X_2$ independently represents —OH, —SH, —PO$_2$, —COOH or —NH$_2$, Y$_1$ represents —O—, —S—, or —NH—, Y$_2$ represents =O, =NH or =S, wherein each of n$_1$ to n$_3$ is independently in a range of 1 to 12, wherein in the Chemical Formula 2, each of R$_1$ to R$_{10}$ independently represents one selected from a group consisting of hydrogen, a substituted or unsubstituted alkyl group having 1 to 6 carbon atoms, a substituted or unsubstituted unsaturated ring compound having 3 to 20 carbon atoms, a substituted or unsubstituted hetero-unsaturated ring compound having 3 to 20 carbon atoms, a substituted or unsubstituted aromatic compound having 6 to 20 carbon atoms, and a substituted or unsubstituted hetero-aromatic compound having 6 to 20 carbon atoms, wherein in the Chemical Formula 3, each of R'$_1$ to R'$_{10}$ independently represents one selected from a group consisting of hydrogen, a substituted or unsubstituted alkyl group having 1 to 6 carbon atoms, a substituted or unsubstituted alkenyl group having 1 to 6 carbon atoms, a substituted or unsubstituted unsaturated ring compound having 3 to 20 carbon atoms, a substituted or unsubstituted hetero-unsaturated ring compound having 3 to 20 carbon atoms, a substituted or unsubstituted aromatic compound having 6 to 20 carbon atoms, and a substituted or unsubstituted hetero-aromatic compound having 6 to 20 carbon atoms, wherein each of n$_1$ to n$_7$ is independently in a range of 1 to 500.

In one implementation of the first aspect, at least one of R$_3$ to R$_6$ in the Chemical Formula 2 includes hydrogen; or each of at least two of R$_1$, R$_2$, R$_7$ to R$_{10}$ in the Chemical Formula 2 includes hydrogen.

In one implementation of the first aspect, each of at least two of R'$_1$, R'$_2$, R'$_7$ to R'$_{10}$ in the Chemical Formula 3 includes at least one of a structure represented by a following Chemical Formula 4 and a structure represented by a following Chemical Formula 5; or at least one of R'$_3$ to R'$_6$ in the Chemical Formula 3 includes at least one of a structure represented by a following Chemical Formula 4 and a structure represented by a following Chemical Formula 5:

[Chemical Formula 4]

[Chemical Formula 5]

wherein in each of the Chemical Formulas 4 and 5, *represents a site bound to an element constituting each of R'$_1$ to R'$_{10}$ in the Chemical Formula 3, wherein R$_{21}$ represents hydrogen, a methylene group or an alkyl group having 1 to 6 carbon atoms, wherein R$_{22}$ represents a methylene group or an alkylene group having 1 to 6 carbon atoms.

In one implementation of the first aspect, the inorganic nano-particle structure further contains at least one of ligands represented by following Chemical Formulas 6 to 11 bound to a surface of the inorganic nano-particle:

[Chemical Formula 6]

-continued

[Chemical Formula 7]

[Chemical Formula 8]

HS—R$_{26}$

[Chemical Formula 9]

H$_2$N—R$_{27}$

[Chemical Formula 10]

[Chemical Formula 11]

wherein in each of the Chemical Formulas 6 to 11, each of R$_{23}$ to R$_{29}$ independently represents one selected from a group consisting of a substituted or unsubstituted alkyl group having 1 to 24 carbon atoms, a substituted or unsubstituted alkenyl group, an unsubstituted or substituted unsaturated ring compound having 3 to 20 carbon atoms, a substituted or unsubstituted aromatic compound having 6 to 20 carbon atoms, and a substituted or unsubstituted hetero-aromatic compound, wherein X$_3$ represents =O, =S or =NH$_2$.

In one implementation of the first aspect, at least one of R$_{23}$ to R$_{25}$ and each of R$_{26}$ to R$_{29}$ includes at least one ethylene group.

In one implementation of the first aspect, the at least one of ligands represented by the Chemical Formulas 6 to 11 bound to the surface of the inorganic nano-particle has a content of 5% inclusive to 90% inclusive based on a total content of the ligands bound to the surface of the inorganic nano-particle.

In one implementation of the first aspect, the composition contains: the inorganic nano-particle structure at 0.1 to 20 parts by weight; the first siloxane compound at 10 to 90 parts by weight; and the second siloxane compound at 9 to 60 parts by weight.

In a second aspect of the present disclosure, there is provided a light-conversion thin-film prepared by curing the composition defined above.

In one implementation of the second aspect, the light-conversion thin-film has a thickness in a range of 0.5 μm to 500 μm.

In a third aspect of the present disclosure, there is provided a display device comprising: a liquid crystal panel; and a backlight for providing light to the liquid crystal panel, wherein the backlight includes the light-conversion thin-film as defined above.

In one implementation of the third aspect, the light-conversion thin-film includes an optical film disposed on a top of a light source.

According to the present disclosure, the inorganic nano-particle structure that absorbs a blue light source and emits red light, the composition containing the inorganic nano-particle structure, the light-conversion thin-film using the composition, and the display device using the film may be realized. In this connection, the inorganic nano-particle structure contains a vinyl group Thus, the hydrosilylation reaction may contribute to the formation of a chemically more robust and stable light-conversion thin-film than the conventional one. Further, the composition contain the siloxanes to allow the formation of a more flexible light-conversion thin-film. The light-conversion thin-film may be used as a color conversion film which can convert blue light from the blue light emitting diode into white light when the blue light emitting diode is used as a backlight source. Thus, the light-conversion thin-film may be included in a liquid crystal panel to realize white color in a liquid crystal display device.

DETAILED DESCRIPTIONS

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

Descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one embodiment, a composition contains an inorganic nano-particle structure containing: an inorganic nano-particle; and a ligand bound to a surface of the inorganic nano-particle, wherein the ligand includes at least one of a first ligand having a structure represented by a following Chemical Formula 1-1 and a second ligand having a structure represented by a following Chemical Formula 1-2; a first siloxane compound having a structure represented by a following chemical Formula 2; and a second siloxane compound having a structure represented by a following chemical Formula 3:

[Chemical Formula 1-1]

[Chemical Formula 1-2]

[Chemical Formula 2]

[Chemical Formula 3]

wherein in the Chemical Formula 1-1 and Chemical Formula 1-2, each of $X_1$ and $X_2$ independently represents —OH, —SH, —$PO_2$, —COOH or —$NH_2$, $Y_1$ represents —O—, —S—, or —NH—, $Y_2$ represents =O, =NH or =S.

Each of $n_1$ to $n_3$ is independently in a range of 1 to 12.

In the Chemical Formula 2, each of $R_1$ to $R_{10}$ independently represents one selected from a group consisting of hydrogen, a substituted or unsubstituted alkyl group having 1 to 6 carbon atoms, a substituted or unsubstituted unsaturated ring compound having 3 to 20 carbon atoms, a substituted or unsubstituted hetero-unsaturated ring compound having 3 to 20 carbon atoms, a substituted or unsubstituted aromatic compound having 6 to 20 carbon atoms, and a substituted or unsubstituted hetero-aromatic compound having 6 to 20 carbon atoms.

In the Chemical Formula 3, each of $R'_1$ to $R'_{10}$ independently represents one selected from a group consisting of hydrogen, a substituted or unsubstituted alkyl group having 1 to 6 carbon atoms, a substituted or unsubstituted alkenyl group having 1 to 6 carbon atoms, a substituted or unsubstituted unsaturated ring compound having 3 to 20 carbon atoms, a substituted or unsubstituted hetero-unsaturated ring compound having 3 to 20 carbon atoms, a substituted or unsubstituted aromatic compound having 6 to 20 carbon atoms, and a substituted or unsubstituted hetero-aromatic compound having 6 to 20 carbon atoms.

Each of $n_1$ to $n_7$ is independently in a range of 1 to 500.

In one embodiment, in order to induce the hydrosilylation reaction with a vinyl group of the ligand or a vinyl group of the second siloxane compound, at least one of $R_3$ to $R_6$ in the Chemical Formula 2 includes hydrogen; or each of at least two of $R_1$, $R_2$, $R_7$ to $R_{10}$ in the Chemical Formula 2 includes hydrogen.

In one embodiment, one example of the first siloxane compound having the structure represented by the Chemical Formula 2 may be represented as:

In one embodiment, in order to induce the hydrosilylation reaction of the ligand, each of at least two of $R'_1$, $R'_2$, $R'_7$ to $R'_{10}$ in the Chemical Formula 3 includes at least one of a structure represented by a following Chemical Formula 4 and a structure represented by a following Chemical Formula 5; or at least one of $R'_3$ to $R'_6$ in the Chemical Formula 3 includes at least one of a structure represented by a following Chemical Formula 4 and a structure represented by a following Chemical Formula 5:

[Chemical Formula 4]

[Chemical Formula 5]

wherein in each of the Chemical Formulas 4 and 5, *represents a site bound to an element constituting each of $R'_1$ to $R'_{10}$ in the Chemical Formula 3, wherein $R_{21}$ represents hydrogen, a methylene group or an alkyl group having 1 to 6 carbon atoms, wherein $R_{22}$ represents a methylene group or an alkylene group having 1 to 6 carbon atoms.

In one embodiment, the inorganic nano-particle structure further contains at least one of ligands represented by following Chemical Formulas 6 to 11 bound to a surface of the inorganic nano-particle:

[Chemical Formula 6]

[Chemical Formula 7]

[Chemical Formula 8]

[Chemical Formula 9]

[Chemical Formula 10]

[Chemical Formula 11]

wherein in each of the Chemical Formulas 6 to 11, each of $R_{23}$ to $R_{29}$ independently represents one selected from a group consisting of a substituted or unsubstituted alkyl group having 1 to 24 carbon atoms, a substituted or unsubstituted alkenyl group, an unsubstituted or substituted unsaturated ring compound having 3 to 20 carbon atoms, a substituted or unsubstituted aromatic compound having 6 to 20 carbon atoms, and a substituted or unsubstituted heteroaromatic compound, wherein $X_3$ represents $=O$, $=S$ or $=NH_2$.

In one embodiment, at least one of $R_{23}$ to $R_{25}$ and each of $R_{26}$ to $R_{29}$ may have at least one double bond structure between carbon atoms. For example, at least one of $R_{23}$ to $R_{25}$ and each of $R_{26}$ to $R_{29}$ may have a structure represented by a following Chemical Formula 12:

[Chemical Formula 12]

In the Chemical Formula 12, *represents a site bound to an element constituting each of at least one of $R_{23}$ to $R_{25}$ and each of $R_{26}$ to $R_{29}$. In one example, at least one of $R_{23}$ to $R_{25}$ and each of $R_{26}$ to $R_{29}$ may include an ethylene group.

In one embodiment, at least one of the ligands represented by the Chemical Formula 6 to 11 may be contained. Alternatively, all of the ligands represented by the Chemical Formula 6 to 11 may be contained.

In one embodiment, the at least one of ligands represented by the Chemical Formulas 6 to 11 bound to the surface of the inorganic nano-particle has a content of 90% or smaller based on a total content of the ligands bound to the surface of the inorganic nano-particle.

In one embodiment, the at least one of ligands represented by the Chemical Formulas 6 to 11 bound to the surface of the inorganic nano-particle has a content of 1% inclusive to 90% inclusive based on a total content of the ligands bound to the surface of the inorganic nano-particle.

In one embodiment, the at least one of ligands represented by the Chemical Formulas 6 to 11 bound to the surface of the inorganic nano-particle has a content of 5% inclusive to 90% inclusive based on a total content of the ligands bound to the surface of the inorganic nano-particle.

In one embodiment, when the content of the ligands represented by the Chemical Formula 6 to 11 is larger than 90%, the stability of the composition may not be improved because a portion of the nano-particle structure bound to the siloxane compound is reduced.

In one embodiment, the composition contains: the inorganic nano-particle structure at 0.1 to 20 parts by weight; the first siloxane compound at 10 to 90 parts by weight; the second siloxane compound at 9 to 60 parts by weight; and the remainder being solvent.

In one embodiment, the composition contains: the inorganic nano-particle structure at 30 to 50 parts by weight; the first siloxane compound at 0.1 to 10 parts by weight; the second siloxane compound at 0.1 to 10 parts by weight; and the remainder being solvent.

In one embodiment, the composition contains: the inorganic nano-particle structure at 20 parts by weight; the first siloxane compound at 25 parts by weight; the second siloxane compound at 20 parts by weight; and the remainder being solvent.

In one embodiment, the solvent may be an organic solvent. For example, the solvent may be toluene.

In one embodiment, the composition may further contain a silicon compound. For example, the silicone compound may be a curable silicone compound. The curable silicone compound may be cured by being maintained at a room temperature, by heating, by infrared irradiation, by electron beam irradiation, etc. A pre-cured state thereof may be a liquid, paste, gel, or solid phase at a room temperature.

In one embodiment, the silicone compound may form a silicone polymer having hydrogen atoms bonded to silicon atoms in a cured state, a silicone polymer having a hydrolyzable group bonded to a silicon atom, a silicone polymer having an alkenyl group bonded to a silicon atom, etc.

For example, the silicone polymer having a hydrogen atom bonded to a silicon atom in the cured state may be formed by mixing a vinyl group-containing organopolysiloxane, organohydrogenpolysiloxane and a platinum catalyst such that the hydrogen atom bonded to the silicon atom is added relative to the vinyl group bonded to the silicon atom at an excessive ratio, and, then, by curing the mixture, For example, the silicone polymer having a hydrolysable group bonded to a silicon atom in a cured state may be formed by mixing a vinyl group-containing organopolysiloxane, organohydrogenpolysiloxane, a platinum catalyst, and a reactive adhesion promoter (e.g., vinyltrialkoxysilane, aryltrialkoxysilane, or γ-methacryloxypropyltrialkoxysilane, etc.) and then by curing the mixture.

For example, the silicone polymer having an alkenyl group bonded to a silicon atom may be formed by mixing a vinyl group-containing organopolysiloxane, organohydrogenpolysiloxane and a platinum compound catalyst such that the vinyl group bonded to the silicon atom is added relative to the hydrogen atom bonded to the silicon atom at an excessive ratio, and, then, by curing the mixture.

For example, the silicone polymer having a hydrogen atom bonded to a silicon atom and having a hydrolysable group bonded to a silicon atom in a cured state may be formed by mixing a vinyl group-containing organopolysiloxane, organohydrogenpolysiloxane, a platinum catalyst, and a reactive adhesion promoter (e.g., vinyltrialkoxysilane, aryltrialkoxysilane, or γ-methacryloxypropyltrialkoxysilane, etc.) such that the hydrogen atom bonded to the silicon atom is added relative to the vinyl group bonded to the silicon atom at an excessive ratio, and, then, by curing the mixture.

For example, the silicone polymer having an alkenyl group bonded to a silicon atom and having a hydrolysable group bonded to a silicon atom in a cured state may be formed by mixing a vinyl group-containing organopolysiloxane, organohydrogenpolysiloxane, a platinum catalyst, and a reactive adhesion promoter (e.g., vinyltrialkoxysilane, aryltrialkoxysilane, or γ-methacryloxypropyltrialkoxysilane, etc.) such that the vinyl group bonded to the silicon atom is added relative to the hydrogen atom bonded to the silicon atom at an excessive ratio, and, then, by curing the mixture. The silicone polymer may be cured by addition reaction or heat.

In one embodiment, a size of the inorganic nano-particle of the inorganic nano-particle structure may be in a range of from 1 to 30 nm.

In one embodiment, the inorganic nano-particle of the inorganic nano-particle structure may absorb ultraviolet or blue light and emit red, orange, yellow and green light.

In one embodiment, the inorganic nano-particle of the inorganic nano-particle structure may be made of one selected from a group consisting of a Group II-VI compound, a Group II-V compound, a Group III-V compound, a Group III-IV compound, a Group III-VI compound, a Group IV-VI compound or mixtures thereof. As used herein, the "mixture" includes not only a simple mixture of the compounds but also ternary compounds, four components compounds, and the mixtures having dopants doped thereto. For example, the inorganic nano-particle of the inorganic nano-particle structure may be made of at least one of a II-VI compound, a III-VI compound, a IV-VI compound, or mixtures thereof.

Examples of the II-VI compounds may include magnesium sulphide (MgS), magnesium selenide (MgSe), magnesium telluride (MgTe), calcium sulfide (CaS), calcium selenide (CaSe), calcium telluride (CaTe), strontium sulfide (SrS), strontium selenide (SrSe), strontium telluride (SrTe), cadmium sulfide (CdS), cadmium selenide (CdSe), tellurium cadmium (CdTe), zinc sulfide (ZnS), zinc selenide (ZnSe), zinc telluride (ZnTe), mercury sulfide (HgS), mercury selenide (HgSe), or mercury telluride (HgTe), etc.

Examples of the Group II-V compounds include zinc phosphide ($Zn_3P_2$), arsenic zinc ($Zn_3As_2$), cadmium phosphide ($Cd_3P_2$), arsenic cadmium ($Cd_3As_2$), cadmium nitride ($Cd_3N_2$) or zinc nitride ($Zn_3N_2$), etc.

Examples of the Group III-V compounds include boron phosphide (BP), aluminum phosphide (AlP), aluminum arsenide (AlAs), aluminum antimonide (AlSb), gallium nitride (GaN), gallium phosphide (GaP), gallium arsenide (GaAs), gallium antimonide (GaSb), indium nitride (InN), indium phosphide (InP), arsenic indium (InAs), indium antimonide (InSb), aluminum nitride (AlN) or boron nitride (BN), etc.

Examples of the Group III-IV compound include boron carbide ($B_4C$), aluminum carbide ($Al_4C_3$), gallium carbide ($Ga_4C$) and the like.

Examples of the III-VI group compound include aluminum sulfide ($Al_2S_3$), aluminum selenide ($Al_2Se_3$), aluminum telluride ($Al_2Te_3$), gallium sulfide ($Ga_2S_3$), gallium selenide ($Ga_2Se_3$), indium sulfide ($In_2S_3$), indium selenide ($In_2Se_3$), gallium telluride ($Ga_2Te_3$) or indium telluride ($In_2Te_3$), etc.

Examples of the IV-VI compound include lead sulfide (PbS), lead selenite (PbSe), tellurium lead (PbTe), tin sulfide (SnS), tin selenide (SnSe) or tin telluride (SnTe), etc.

In one embodiment, examples of the II-VI group compound may include CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe or HgZnSTe.

In one embodiment, examples of the III-V group compound may include GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs or InAlPAs.

In one embodiment, the IV-VI group compound may be SbTe.

In one embodiment, the inorganic nano-particle of the inorganic nano-particle structure may have a core@shell structure.

For example, the inorganic nano-particle of the inorganic nano-particle structure may have a core@shell structure. Each of the core and shell of the inorganic nano-particle of the inorganic nano-particle structure may be made of the compound as defined above. The compound may be used alone or the compound may be used in combination of two or more, to form the core or shell.

A bandgap of the compound constituting the core may be narrower than a bandgap of the compound constituting the shell. However, the present disclosure is not limited thereto. In one example, when the inorganic nano-particle of the inorganic nano-particle structure has a core@shell structure, the compound constituting the shell may be different from the compound constituting the core. For example, the inorganic nano-particle of the inorganic nano-particle structure may have, as a core@ shell structure, a CdZnS@ZnS structure containing a core made of CdZnS and a shell made of ZnS.

In another example, the inorganic nano-particle of the inorganic nano-particle structure may have a core@multiple-shell structure with the shell having at least two layers. For example, the inorganic nano-particle of the inorganic nano-particle structure may have a CdZnS@ZnS@ZnS (core@first shell@second shell) structure composed of a core made of CdZnS, a first shell enclosing a surface of the core and made of ZnS, and a second shell enclosing a surface of the first shell and made of ZnS. For example, the inorganic nano-particle of the inorganic nano-particle structure may not have a core@ shell structure, but may have a single structure. The single structure may be made only of the II-VI compound.

The inorganic nano-particle of the inorganic nano-particle structure may further contain a cluster molecule as a seed. The cluster molecule refers to a compound that acts as a seed in a process of producing the inorganic nanoparticle of the inorganic nanoparticle structure. A precursor of a compound constituting the inorganic nano-particle of the inorganic nano-particle structure is grown on the cluster molecule. Thus, the inorganic nano-particle of the inorganic nano-particle structure may be formed.

In one embodiment, the inorganic nano-particle of the inorganic nano-particle structure may have a stabilizing compound coordinated to a surface thereof in the production process thereof. For example, the stabilizing compound may be at least partially exchanged with the ligands having the structures represented by the Chemical Formula 1-1 and Chemical Formula 1-2 respectively.

In one embodiment, the ligands represented by the Chemical Formulas 1-1 and 1-2 bound to the surface of the inorganic nano-particle has a content of 1% inclusive to 95% inclusive based on a total content of the ligands bound to the surface of the inorganic nano-particle. In this connection, ligands other than the ligands represented by the Chemical Formulas 1-1 and 1-2 and bound to the surface of the inorganic nano-particle has a content of 5% inclusive to 99% inclusive based on a total content of the ligands bound to the surface of the inorganic nano-particle.

For example, a ligand bonded to the surface of the inorganic nanoparticle may include a ligand with an alcohol group. For example, different types of ligands may be bonded to the surface to control hydrophilic and hydrophobic properties.

The ligand and stabilizing compound may act to prevent adjacent inorganic nanoparticles from agglomerating and quenching each other. Examples of the ligand and the stabilizing compound may include a carboxylic acid compound or amine compound having an alkyl group having 6 to 30 carbon atoms. Examples of the amine compound having the alkyl group may include hexadecylamine or octylamine Another example of the ligand may include a carboxylic acid compound or amine compound having an alkenyl group having 6 to 30 carbon atoms. Alternatively, the stabilizing compound may include a phosphine compound such as trioctylphosphine, triphenolphosphine, t-butylphosphine, and the like; a phosphine oxide such as trioctylphosphine oxide; pyridine or thiophene. Alternatively, the stabilizing compound may include a silane compound having at least one functional group selected from a vinyl group, an aryl group, an acrylic group, an amine group, a methacrylate group, an epoxy group, or the like. The stabilizing compound may have an alcohol group at a terminal thereof. Further, the stabilizing compound may be a polymer having a molecular weight of from 1,000 to 500,000 and having a urethane bond formed via reaction between an isocyanate group and an alcohol group.

A light-conversion thin-film according to an embodiment of the present disclosure may be embodied as an optical film or a thin film layer within a display device. The light-conversion thin-film may be prepared by curing the composition in accordance with the present disclosure as described above.

In one embodiment, a thickness of the light-conversion thin-film may be in a range of from 0.5 μm to 500 μm.

In one embodiment, the light-conversion thin-film may be used for a backlight or liquid crystal panel in a liquid crystal display.

A display device according to an embodiment of the present disclosure includes a liquid crystal panel; and a backlight for providing light to the liquid crystal panel. The backlight includes the light-conversion thin-film according to the embodiment of the present disclosure.

In one embodiment, the light-conversion thin-film may be embodied as an optical film disposed on a top of a light source.

Hereinafter, the Present Examples of the present disclosure are described in detail. However, the following Present Examples are only some embodiments of the present disclosure, and the present disclosure should not be interpreted as being limited to the following Present Examples.

Production Example 1. Green Inorganic Nano-Particle Structure Production

A green inorganic nano-particle structure (green light-emitting structure) with a hydroxy-bearing ligand was produced in the Present Example of the present disclosure.

Into a 50 ml three-necked round flask equipped with a refluxing device, 0.05 g of indium acetate (Aldrich), 0.38 g of zinc acetate (Aldrich), 1.45 g of oleic acid (Aldrich), 15 ml of 1-octadecene (Aldrich) were input. The flask was heated to 110 degrees C. and then was maintained at about 0.1 torr by using a vacuum pump for 1 hour. The vacuum is then removed. Then, $N_2$ gas was introduced into the flask which was heated to 280° C. Then, 0.43 g of tris(trimethylsilyl)phosphine (Gelest) was added thereto at one time.

Then, 0.07 g of sulfur (Aldrich) was dissolved in 1 ml of trioctyl phosphine to from a solution. This solution was charged into the flask. The temperature thereof was lowered to 240 degrees C. and was maintained for 3 hours. Thereafter, while cooling the flask to a room temperature, a mixed solution of 2 ml of 1-dodecanethiol (Aldrich) and 1 ml of 6-mercaptohexanol (Aldrich) was added to the flask which was further stirred for 30 minutes. Subsequently, 100 ml of ethanol (Aldrich) was added to the flask which was stirred for about 5 minutes. Then, a precipitate was obtained using a centrifugal separator. The obtained powder shaped precipitate was dissolved in toluene in an amount of 10% by weight. 1 ml of allyl isocyanate (Aldrich) was added thereto, followed by stirring for 1 hour.

Thus, a green luminescent inorganic nanoparticle structure was obtained. Then, the green luminescent inorganic nanoparticle structure was analyzed using an Absolute PL quantum yield spectrometer QE-2100 instrument from Otsuka electronics. From the analysis, a quantum yield was 58%. A photoluminescence $1_{max}$ was 550 nm. A Full Width of Half Max (FWHM) was 62 nm. Further, the green light-emitting inorganic nanoparticle produced in the Production Example 1 was measured in terms of a particle size using a TEM (JEOL/JEM-3010). The size was about 6 nm.

Production Example 2. Green Inorganic Nano-Particle Structure Production

Into a 50 ml three-necked round flask equipped with a refluxing device, 0.05 g of indium acetate (Aldrich), 0.38 g of zinc acetate (Aldrich), 1.45 g of oleic acid (Aldrich), 15 ml of 1-octadecene (Aldrich) were input. The flask was heated to 110 degrees C. and then was maintained at about 0.1 torr by using a vacuum pump for 1 hour. The vacuum is then removed. Then, $N_2$ gas was introduced into the flask which was heated to 280° C. Then, 0.43 g of tris(trimethylsilyl)phosphine (Gelest) was added thereto at one time.

Then, 0.07 g of sulfur (Aldrich) was dissolved in 1 ml of trioctyl phosphine to from a solution. This solution was charged into the flask. The temperature thereof was lowered to 240 degrees C. and was maintained for 3 hours. Thereafter, we cooled the flask to a room temperature. Subsequently, 100 ml of ethanol (Aldrich) was added to the flask which was stirred for about 5 minutes. Then, a precipitate was obtained using a centrifugal separator. The obtained powder shaped precipitate was dissolved in toluene in an amount of 10% by weight.

Thus, a green luminescent inorganic nanoparticle structure was obtained. Then, the green luminescent inorganic nanoparticle structure was analyzed using an Absolute PL quantum yield spectrometer QE-2100 instrument from Otsuka electronics. From the analysis, a quantum yield was 53%. A photoluminescence $l_{max}$ was 548 nm. A Full Width of Half Max (FWHM) was 68 nm. Further, the green light-emitting inorganic nanoparticle produced in the Production Example 2 was measured in terms of a particle size using a TEM (JEOL/JEM-3010). The size was about 5 nm.

Light-Conversion Thin-Film Production

The composition according to the Present Example of the present disclosure was subjected to a predetermined pretreatment process and then applied on a glass substrate to a thickness of 50 μm using a spin coating method. Subsequently, the coating is cured at 150 degrees C. for 10 minutes to form a coating film. A color conversion layer made of the above-described curable composition was obtained. The color conversion layer had excellent optical properties.

TABLE 1

|  | Present Example 1 | Comparative Example 1 | Comparative Example 2 | Comparative Example 3 |
| --- | --- | --- | --- | --- |
| Dispersion (g) in Production Example 1 | 5 | — | 5 | — |
| Dispersion (g) in Production Example 2 | — | 5 | — | 5 |
| Sylgard 184 A (g) | 2.2 | 2.2 | — | — |
| Sylgard 184 B (g) | 0.3 | 0.3 | — | — |
| Poly(methylmethacrylate) (g) | — | — | 2.5 | 2.5 |
| Toluene (g) | 5 | 5 | 25 | 25 |

Dispersion in the Production Example 1 refers to dispersion of the inorganic nano-particle structures of Production Example 1 of the present disclosure. Dispersion in the Production Example 2 refers to dispersion of the inorganic nano-particle structures of Production Example 2 of the present disclosure. Each of Present Example 1 and Comparative Example 1 used Sylgard 184 A and Sylgard 184 B (Dow corning) as examples of the first and siloxane polymers respectively. In Comparative Example 2 and Comparative Example 3, Sylgard 184 A and Sylgard 184 B (Dow corning) were absent and only poly (methylmethacrylate) (Aldrich) was present.

The above prepared dispersions were coated on a 5 cm×5 cm glass with a spin coater at 300 RPM for 10 seconds. The coating was pre-baked for 1 minute on a hot plate at 100 degrees C. and then cured at 150 degrees C. for 30 minutes using an oven.

Figure 1:
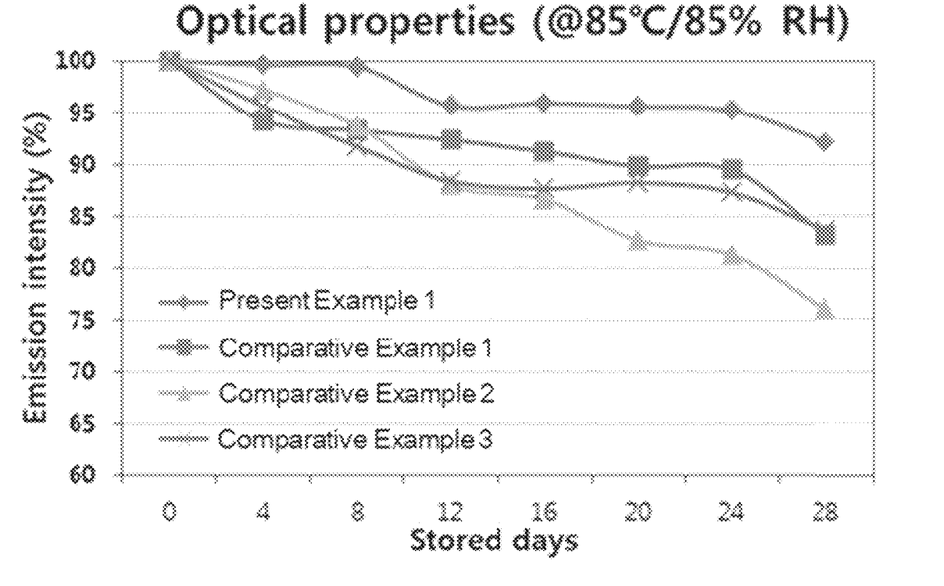
FIG. 1 shows comparison data between Present Example and Comparative Examples.

FIG. 1 shows comparison data between Present Example and Comparative Examples. More specifically, FIG. 1 is a graph illustrating an initial photoluminescence (emission value) measured using a photoluminescence spectrometer (Agilent), and, then, photoluminescence intensity decrease when a sample was stored for one month in a chamber at a relative humidity 85%/temperature 85° C., and photoluminescence was measured periodically to measure the photoluminescence intensity. Referring to FIG. 1, it was confirmed that, in the Present Example 1 where the composition containing the inorganic nano-particle structure in accordance with the present disclosure has the hydrosilylation reaction, the luminescence value was stable and high compared with Comparative Examples in which the hydrosilylation reaction is absent.

In detail, in the Present Example 1 using the composition in accordance with the present disclosure, the light emitting efficiency was 95% or greater even when the sample was maintained for 16 days or longer under a high temperature and high humidity condition. However, in Comparative Example 1 to 3, the light emitting efficiency has been reduced to a value than lower than 95%. Further, when the sample was left for more than 28 days, Comparative Examples 1 to 3 showed luminous efficiencies of lower than 85% and lower than 80%. However, in the case of Present Example 1 produced according to the present disclosure, the luminous efficiency was greater than 90% even after the sample was left for 28 days or longer.

Therefore, the present disclosure may provide a highly stable light-conversion thin-film, the composition constituting the film, and the inorganic nano-particle structure constituting the composition. Thus, a liquid crystal display device or an electroluminescent diode having excellent stability can be produced using the highly stable light-conversion thin-film, the composition constituting the film, and the inorganic nano-particle structure constituting the composition.

In accordance with the present disclosure, the functional groups that may participate in the hydrosilylation reaction when the siloxane compounds currently used as LED encapsulants are cured may be introduced so that the optical properties of the quantum dots, that is, the inorganic nano-particle structure may not be reduced. Thus, the functional groups may react with the siloxane compounds, thus to form a quantum dot pattern converting the color light from the blue LED and more chemically stable than the existing composition based quantum dot pattern. Further, the light-conversion thin-film may be produced using the composition in accordance with the present disclosure. Further, the light-conversion thin-film may be used for a liquid crystal display.

According to the present disclosure, the inorganic nano-particle structure that absorbs a blue light source and emits red light, and the composition containing the inorganic nano-particle structure emitting the red light may be realized. Further, since the inorganic nano-particle structure contains the vinyl group, the composition containing the inorganic nano-particle structure may be used for production of the light-conversion thin-film via a hydrosilylation reaction of the composition without solvent. Further, the production method of the inorganic nano-particle structure, the composition and the light-conversion thin-film may be realized. Further, the ligands with the vinyl group in the inorganic nano-particle structure may participate in the cross-linking reaction to form the chemically more robust light-conversion thin-film. Further, a more flexible light-conversion thin-film can be obtained via the composition containing the siloxane. Furthermore, the light-conversion thin-film may be used as a color conversion film which can convert blue light emitting from the blue diode into white light when the blue light emitting diode is employed as a backlight source. Furthermore, the light-conversion thin-film may be included in a liquid crystal panel which may realize white color in a liquid crystal display device.

Although the preferred embodiments of the present disclosure have been described and illustrated, it will be understood by those skilled in the art that various changes in form and details may be made thereto without departing from the spirit and scope of the present disclosure as set forth in the following claims.

What is claimed is:

1. A composition containing:
an inorganic nano-particle structure containing:
  an inorganic nano-particle; and
  a ligand bound to a surface of the inorganic nano-particle, wherein the ligand includes at least one of a first ligand having a structure represented by a following Chemical Formula 1-1 and a second ligand having a structure represented by a following Chemical Formula 1-2;
a first siloxane compound having a structure represented by a following chemical Formula 2; and
a second siloxane compound having a structure represented by a following chemical Formula 3:

[Chemical Formula 1-1]

[Chemical Formula 1-2]

[Chemical Formula 2]

[Chemical Formula 3]

wherein in the Chemical Formula 1-1 and Chemical Formula 1-2, each of $X_1$ and $X_2$ independently represents —OH, —SH, —PO$_2$, —COOH or —NH$_2$, $Y_1$ represents —O—, —S—, or —NH—, $Y_2$ represents =O, =NH or =S, wherein each of $n_1$ to $n_3$ is independently in a range of 1 to 12, wherein in the Chemical Formula 2, each of $R_1$ to $R_{10}$ independently represents one selected from a group consisting of hydrogen, a substituted or unsubstituted alkyl group having 1 to 6 carbon atoms, a substituted or unsubstituted unsaturated ring compound having 3 to 20 carbon atoms, a substituted or unsubstituted hetero-unsaturated ring compound having 3 to 20 carbon atoms, a substituted or unsubstituted aromatic compound having 6 to 20 carbon atoms, and a substituted or unsubstituted hetero-aromatic compound having 6 to 20 carbon atoms, wherein in the Chemical Formula 3, each of $R'_1$ to $R'_{10}$ independently represents one selected from a group consisting of hydrogen, a substituted or unsubstituted alkyl group having 1 to 6 carbon atoms, a substituted or unsubstituted alkenyl group having 1 to 6 carbon atoms, a substituted or unsubstituted unsaturated ring compound having 3 to 20 carbon atoms, a substituted or unsubstituted hetero-unsaturated ring compound having 3 to 20 carbon atoms, a substituted or unsubstituted aromatic compound having 6 to 20 carbon atoms, and a substituted or unsubstituted hetero-aromatic compound having 6 to 20 carbon atoms, wherein each of $n_1$ to $n_7$ is independently in a range of 1 to 500.

2. The composition of claim 1, wherein at least one of $R_3$ to $R_6$ in the Chemical Formula 2 includes hydrogen; or each of at least two of $R_1$, $R_2$, $R_7$ to $R_{10}$ in the Chemical Formula 2 includes hydrogen.

3. The composition of claim 1, wherein each of at least two of $R'_1$, $R'_2$, $R'_7$ to $R'_{10}$ in the Chemical Formula 3 includes at least one of a structure represented by a following Chemical Formula 4 and a structure represented by a following Chemical Formula 5; or
at least one of $R'_3$ to $R'_6$ in the Chemical Formula 3 includes at least one of a structure represented by a following Chemical Formula 4 and a structure represented by a following Chemical Formula 5:

[Chemical Formula 4]

[Chemical Formula 5]

wherein in each of the Chemical Formulas 4 and 5,
*represents a site bound to an element constituting each of $R'_1$ to $R'_{10}$ in the Chemical Formula 3,
wherein $R_{21}$ represents hydrogen, a methylene group or an alkyl group having 1 to 6 carbon atoms,
wherein $R_{22}$ represents a methylene group or an alkylene group having 1 to 6 carbon atoms.

4. The composition of claim 1, wherein the inorganic nano-particle structure further contains at least one of ligands represented by following Chemical Formulas 6 to 11 bound to a surface of the inorganic nano-particle:

[Chemical Formula 6]

[Chemical Formula 7]

[Chemical Formula 8]

[Chemical Formula 9]

[Chemical Formula 10]

-continued

[Chemical Formula 11]

wherein in each of the Chemical Formulas 6 to 11, each of $R_{23}$ to $R_{29}$ independently represents one selected from a group consisting of a substituted or unsubstituted alkyl group having 1 to 24 carbon atoms, a substituted or unsubstituted alkenyl group, an unsubstituted or substituted unsaturated ring compound having 3 to 20 carbon atoms, a substituted or unsubstituted aromatic compound having 6 to 20 carbon atoms, and a substituted or unsubstituted hetero-aromatic compound, wherein $X_3$ represents =O, =S or =NH$_2$.

5. The composition of claim 4, wherein at least one of $R_{23}$ to $R_{25}$ and each of $R_{26}$ to $R_{29}$ includes at least one ethylene group.

6. The composition of claim 4, wherein the at least one of ligands represented by the Chemical Formulas 6 to 11 bound to the surface of the inorganic nano-particle has a content of 5% inclusive to 90% inclusive based on a total content of the ligands bound to the surface of the inorganic nano-particle.

7. The composition of claim 1, wherein the composition contains:
   the inorganic nano-particle structure at 0.1 to 20 parts by weight;
   the first siloxane compound at 10 to 90 parts by weight; and
   the second siloxane compound at 9 to 60 parts by weight.

8. A light-conversion thin-film prepared by curing the composition of claim 1.

9. The light-conversion thin-film of claim 8, wherein the light-conversion thin-film has a thickness in a range of 0.5 μm to 500 μm.

10. A display apparatus comprising:
    a liquid crystal panel; and
    a backlight for providing light to the liquid crystal panel,
    wherein the backlight includes the light-conversion thin-film of claim 8.

11. The display apparatus of claim 10, wherein the light-conversion thin-film includes an optical film disposed on a top of a light source.

* * * * *